(12) United States Patent
Okaguchi

(10) Patent No.: US 11,605,773 B2
(45) Date of Patent: Mar. 14, 2023

(54) PIEZOELECTRIC ELEMENT DRIVING CIRCUIT AND FLUID CONTROL APPARATUS

(71) Applicant: Murata Manufacturing Co., Ltd., Kyoto (JP)

(72) Inventor: Kenjiro Okaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1337 days.

(21) Appl. No.: 15/693,951

(22) Filed: Sep. 1, 2017

(65) Prior Publication Data

US 2017/0365768 A1  Dec. 21, 2017

Related U.S. Application Data

(63) Continuation of application No. PCT/JP2016/081803, filed on Oct. 27, 2016.

(30) Foreign Application Priority Data

Oct. 30, 2015  (JP) .............................. JP2015-215026

(51) Int. Cl.
*H01L 41/04* (2006.01)
*F04B 9/00* (2006.01)
(Continued)

(52) U.S. Cl.
CPC .......... *H01L 41/042* (2013.01); *B06B 1/0207* (2013.01); *F04B 9/00* (2013.01);
(Continued)

(58) Field of Classification Search
CPC .................................................... H01L 41/042
(Continued)

(56) References Cited

U.S. PATENT DOCUMENTS

2010/0001618 A1* 1/2010 Fukagawa ........... F02D 41/2096
310/317
2011/0068657 A1  3/2011 Sunaga et al.
(Continued)

FOREIGN PATENT DOCUMENTS

EP  1 814 167 A2  8/2007
JP  H03-120768 A  5/1991
(Continued)

OTHER PUBLICATIONS

English translation of the International Search Report for International Application No. PCT/JP2016/081803 dated Jan. 17, 2017.
(Continued)

*Primary Examiner* — Derek J Rosenau
(74) *Attorney, Agent, or Firm* — Pearne & Gordon LLP

(57) ABSTRACT

A piezoelectric element driving circuit includes a boosting circuit, a driving circuit, a waveform shaping circuit, and a computing circuit. The driving circuit includes a differential amplifier circuit with an LPF, an amplifier circuit with a BPF, an inverter, a resistor, and a comparator. The driving circuit applies a driving signal to a piezoelectric element of a piezoelectric pump. The waveform shaping circuit extracts a voltage signal from the driving circuit. On the basis of the voltage signal, the waveform shaping circuit and the computing circuit determine a voltage value corresponding to driving current flowing through the piezoelectric element. The computing circuit outputs a control signal to the boosting circuit on the basis of the voltage value. The boosting circuit sets the value of a DC supply voltage on the basis of the control signal, and outputs the DC supply voltage.

14 Claims, 12 Drawing Sheets

(51) Int. Cl.
- *B06B 1/02* (2006.01)
- *F04B 49/08* (2006.01)
- *F04B 49/06* (2006.01)
- *F04B 17/00* (2006.01)

(52) U.S. Cl.
CPC .......... *F04B 17/003* (2013.01); *F04B 49/065* (2013.01); *F04B 49/08* (2013.01); *F04B 2203/0402* (2013.01)

(58) Field of Classification Search
USPC ........................................................ 310/317
See application file for complete search history.

(56) References Cited

U.S. PATENT DOCUMENTS

| | | |
|---|---|---|
| 2011/0068658 A1 | 3/2011 | Kamitani et al. |
| 2012/0133307 A1 | 5/2012 | Furuya et al. |
| 2013/0321507 A1 | 12/2013 | Mardilovich et al. |
| 2016/0116287 A1 | 4/2016 | Fujii et al. |

FOREIGN PATENT DOCUMENTS

| | | |
|---|---|---|
| JP | H05-299717 A | 11/1993 |
| JP | H07-107754 A | 4/1995 |
| JP | 2007-205173 A | 8/2007 |
| JP | 2011-083767 A | 4/2011 |
| JP | 2011-087455 A | 4/2011 |
| JP | 2012-110867 A | 6/2012 |
| JP | 2014-514188 A | 6/2014 |
| JP | 2015-159724 A | 9/2015 |
| WO | 2009-014148 A1 | 1/2009 |
| WO | 2015-004872 A1 | 1/2015 |

OTHER PUBLICATIONS

International Search Report issued in Patent Application No. PCT/JP2016/081803 dated Jan. 17, 2017.

Written Opinion issued in Patent Application No. PCT/JP2016/081803 dated Jan. 17, 2017.

\* cited by examiner

PIEZOELECTRIC ELEMENT DRIVING CIRCUIT AND FLUID CONTROL APPARATUS

This is a continuation of International Application No. PCT/JP2016/081803 filed on Oct. 27, 2016 which claims priority from Japanese Patent Application No. 2015-215026 filed on Oct. 30, 2015. The contents of these applications are incorporated herein by reference in their entireties.

BACKGROUND

Field of the Disclosure

The present disclosure relates to a piezoelectric element driving circuit that applies a driving signal to a piezoelectric element, and a fluid control apparatus that includes the piezoelectric element driving circuit.

Piezoelectric element driving circuits that apply a driving signal to a piezoelectric element have been known. For example, Patent Document 1 discloses a piezoelectric element driving circuit that includes a differential amplifier circuit, an amplifier circuit, and an inverting circuit. The piezoelectric element driving circuit is connected to a piezoelectric element included in a piezoelectric pump.

The piezoelectric element driving circuit applies a driving signal based on a first control signal and a second control signal to the piezoelectric element. The differential amplifier circuit generates a differential signal on the basis of the driving signal. The amplifier circuit amplifies the differential signal and outputs it. The output signal becomes the first control signal, and also the second control signal generated by the inverting circuit by inverting the polarity of the first control signal. That is, the piezoelectric element driving circuit performs a feedback operation.

With this configuration, the piezoelectric element driving circuit can drive the piezoelectric element at a resonant frequency. The piezoelectric pump thus generates pressure (negative or positive pressure) by driving of the piezoelectric element and transfers fluid.

Patent Document 1: Japanese Unexamined Patent Application Publication No. 2015-159724

BRIEF SUMMARY

As driving current increases in the piezoelectric element driving circuit disclosed in Patent Document 1, the pressure generated by the piezoelectric pump and the flow rate or efficiency may decrease. That is, as the driving current increases, power loss increases and battery life may shorten. Also, when excessive driving current flows through the piezoelectric element, the amplitude of the piezoelectric element significantly increases and this may cause the piezoelectric element to crack.

As a solution to this, a pressure sensor or a flow rate sensor may be used to measure the pressure of, or the flow rate in, the piezoelectric pump and regulate the driving current on the basis of the measurement result. However, this significantly increases the cost of manufacturing the piezoelectric element driving circuit and the fluid control apparatus, at least by the cost of using the pressure sensor or flow rate sensor.

The present disclosure provides a piezoelectric element driving circuit and a fluid control apparatus that can drive a piezoelectric element under optimum conditions without necessarily using a pressure sensor or a flow rate sensor.

A piezoelectric element driving circuit according to the present disclosure includes a power supply circuit, a driving circuit, and a control circuit. The power supply circuit outputs a DC supply voltage. The driving circuit generates a driving signal on the basis of the DC supply voltage output from the power supply circuit. The driving circuit applies the driving signal to a piezoelectric element. The control circuit extracts, from the driving circuit, a voltage signal proportional to driving current flowing through the piezoelectric element. The control circuit can extract, for example, a sinusoidal voltage signal from the driving circuit.

The control circuit determines a voltage value corresponding to the current value of the driving current on the basis of the voltage signal. The control circuit outputs a control signal that reduces changes in the driving current on the basis of the voltage value. The power supply circuit sets the value of the DC supply voltage on the basis of the control signal.

In this configuration, the power supply circuit sets the value of the DC supply voltage on the basis of the control signal so as to reduce changes in the driving current, and then outputs the DC supply voltage. Thus, even when the driving current changes, the control circuit regulates the driving current to a constant current value.

Therefore, the piezoelectric element driving circuit having this configuration can always drive the piezoelectric element under optimum conditions which maximize the pressure of a pump and the flow rate in, or efficiency of, the pump. This reduces power loss, and increases the life of a battery connected to the piezoelectric element driving circuit.

The piezoelectric element driving circuit having this configuration can prevent excessive driving current from flowing through the piezoelectric element. The piezoelectric element driving circuit having this configuration can thus prevent the piezoelectric element from cracking.

Therefore, the piezoelectric element driving circuit having this configuration can drive the piezoelectric element under optimum conditions without necessarily using a pressure sensor or a flow rate sensor.

The power supply circuit can be a boosting circuit configured to boost a DC voltage input from a battery to the DC supply voltage and output the DC supply voltage.

Even when the battery drives the piezoelectric element, the piezoelectric element driving circuit having this configuration can drive the piezoelectric element with large amplitude.

The driving circuit can include a resistor connected in series to the piezoelectric element, and a differential amplifier circuit configured to amplify a difference between voltages generated at both ends of the resistor by the driving current and output the voltage signal.

The control circuit may output the control signal using an amplifier circuit capable of amplifying in a nonlinear region.

With this configuration, the driving current can be stably and reliably made constant.

A fluid control apparatus according to the present disclosure includes the piezoelectric element driving circuit of the present disclosure, and a piezoelectric pump including the piezoelectric element driven by the piezoelectric element driving circuit of the present disclosure. The piezoelectric pump is configured to transfer fluid by driving of the piezoelectric element. For example, the piezoelectric pump suctions fluid by generating negative pressure, or discharges compressed fluid by generating positive pressure.

With this configuration, the fluid control apparatus according to the present disclosure includes the piezoelectric element driving circuit of the present disclosure, and thus has the same effect as the piezoelectric element driving circuit of the present disclosure.

The present disclosure can drive the piezoelectric element under optimum conditions without necessarily using a pressure sensor or a flow rate sensor.

DETAILED DESCRIPTION

A fluid control apparatus 100 according to a first embodiment of the present disclosure will be described with reference to the drawings.

Figure 1:
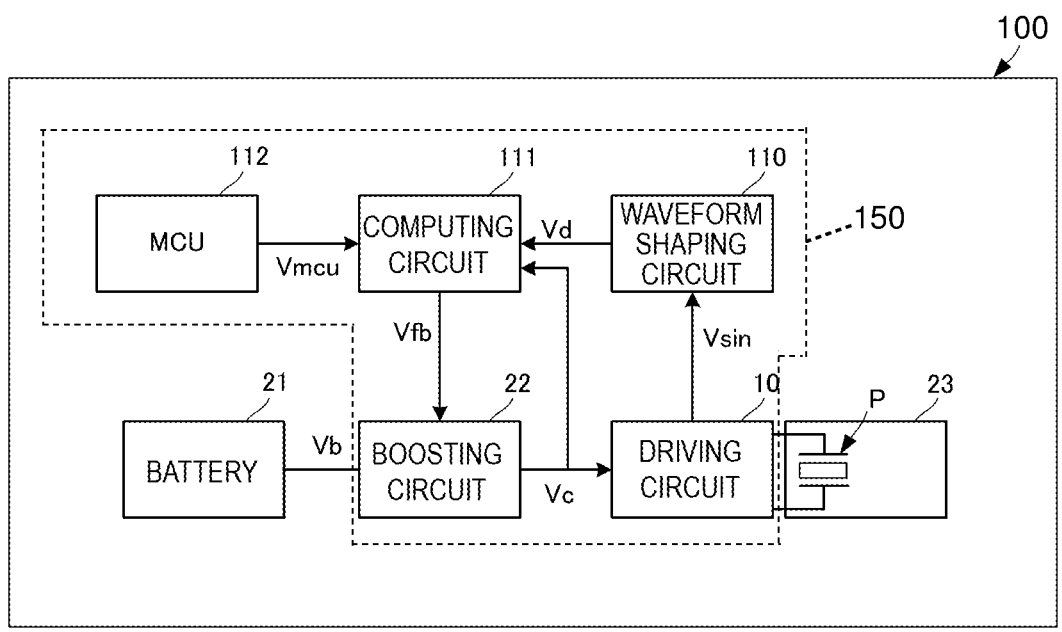
FIG. 1 is a block diagram illustrating a configuration of a fluid control apparatus 100 according to a first embodiment.
Figure 2:
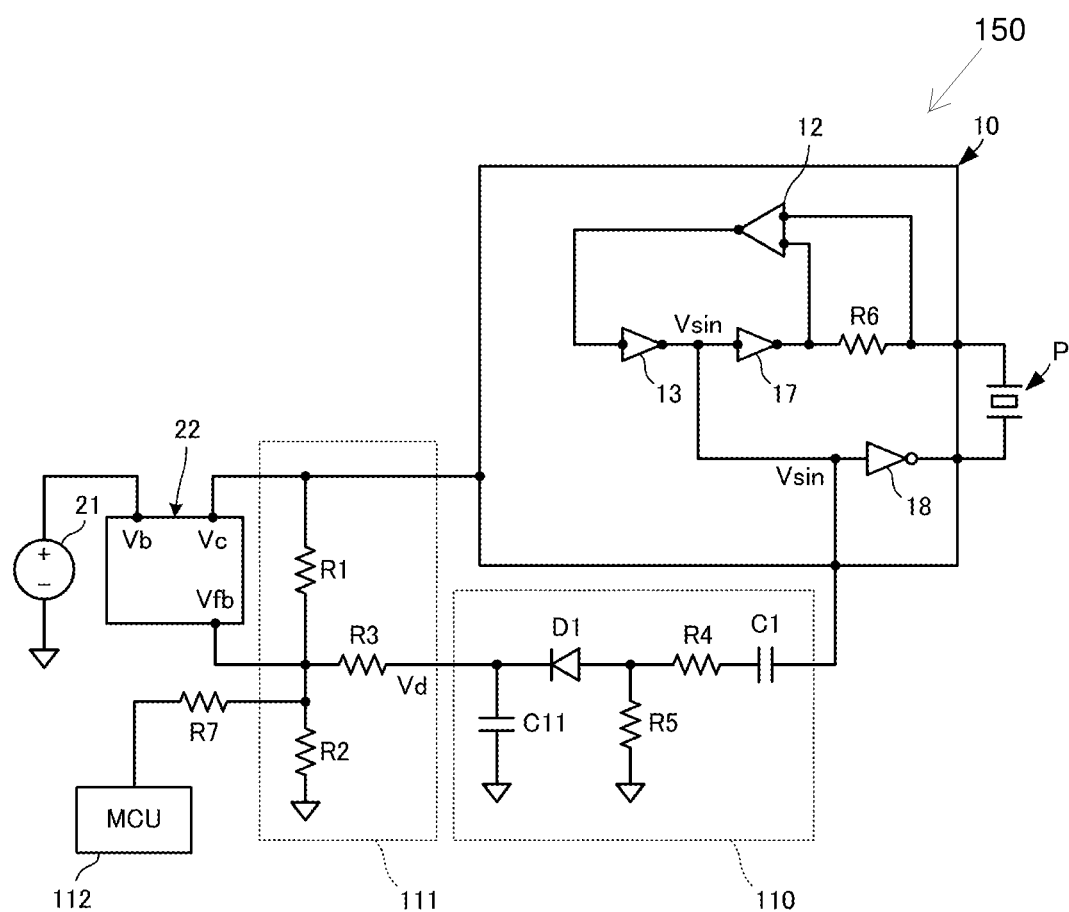
FIG. 2 is a circuit diagram illustrating a configuration of a piezoelectric element driving circuit 150 illustrated in FIG. 1.
Figure 3:
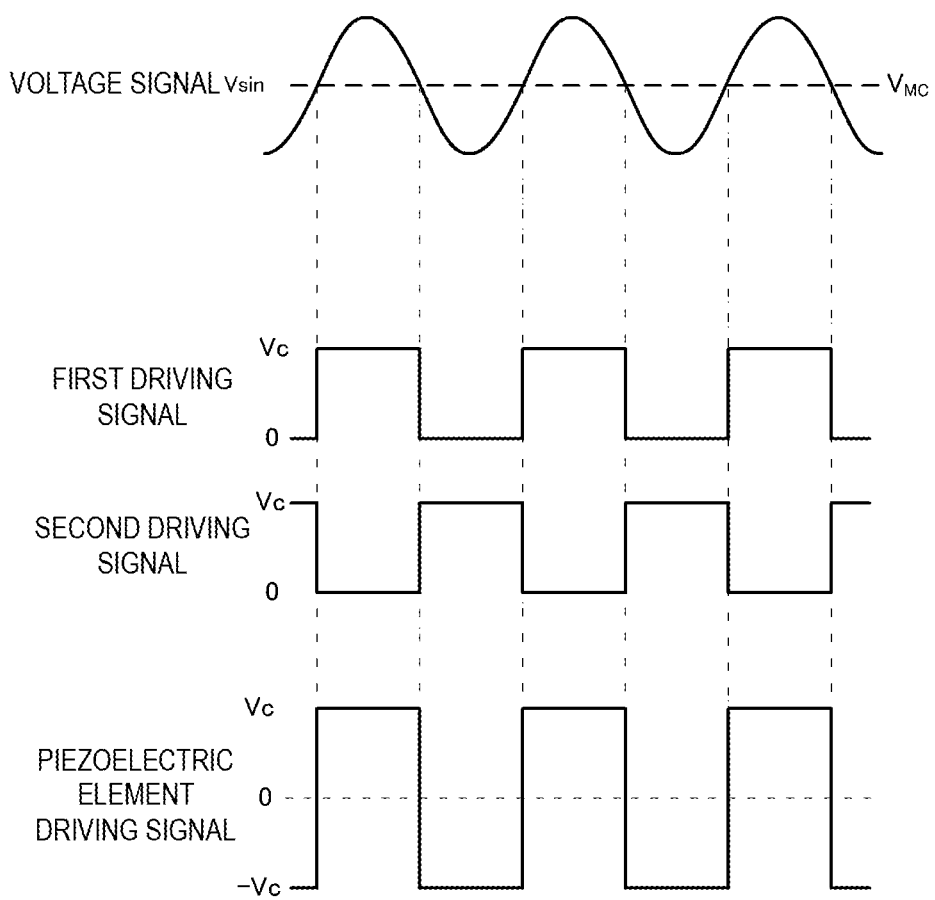
FIG. 3 illustrates voltage waveforms in the piezoelectric element driving circuit 150 illustrated in FIG. 1.
Figure 4:
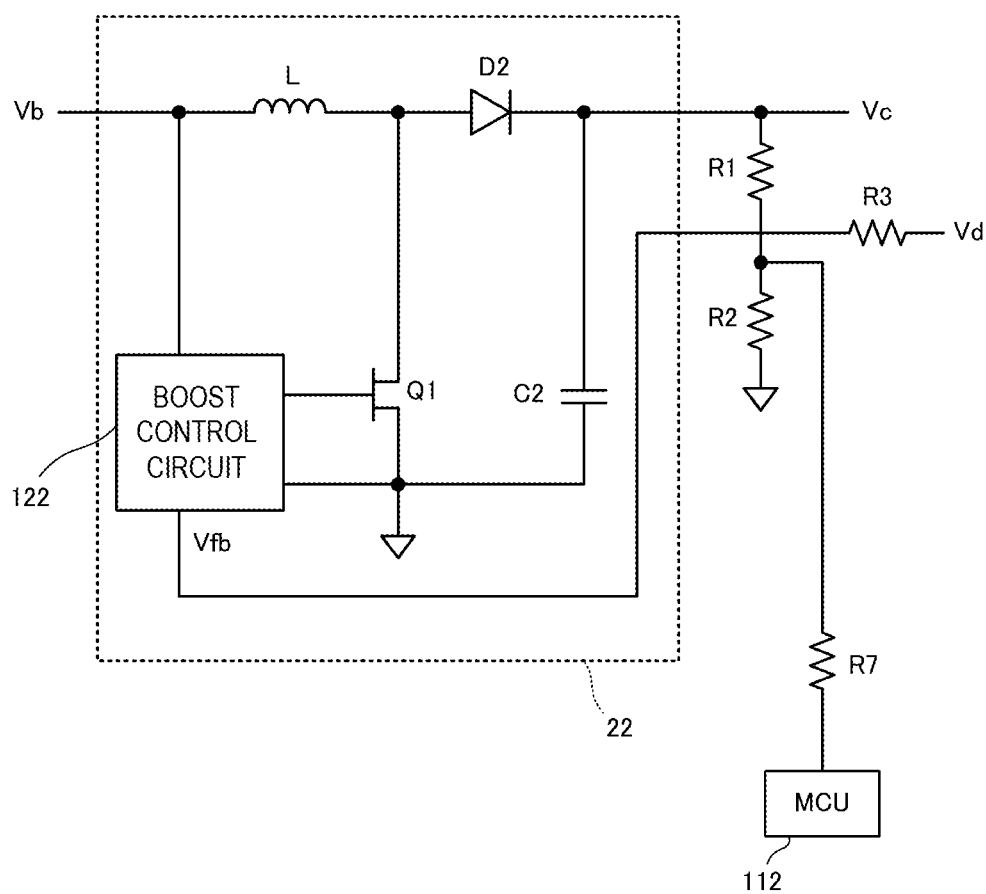
FIG. 4 is a circuit diagram illustrating a configuration of a boosting circuit 22 illustrated in FIG. 1.

FIG. 1 is a block diagram illustrating a configuration of the fluid control apparatus 100 according to the first embodiment. FIG. 2 is a circuit diagram illustrating a configuration of a piezoelectric element driving circuit 150 illustrated in FIG. 1. FIG. 3 illustrates voltage waveforms in the piezoelectric element driving circuit 150 illustrated in FIG. 1. FIG. 4 is a circuit diagram illustrating a configuration of a boosting circuit 22 illustrated in FIG. 1.

As illustrated in FIG. 1, the fluid control apparatus 100 includes a battery 21, a piezoelectric pump 23, and the piezoelectric element driving circuit 150. The piezoelectric element driving circuit 150 includes the boosting circuit 22, a driving circuit 10, a waveform shaping circuit 110, a computing circuit 111, and a microcontrol unit (MCU) 112. The MCU 112 controls the operation of each part of the fluid control apparatus 100.

The waveform shaping circuit 110, the computing circuit 111, and the MCU 112 form a control circuit of the present disclosure.

The piezoelectric pump 23 includes a piezoelectric element P. The piezoelectric pump 23 generates negative or positive pressure by driving of the piezoelectric element P. The fluid control apparatus 100 transfers fluid by the piezoelectric pump 23.

The fluid control apparatus 100 is, for example, a suction device that suctions fluid by operation of the piezoelectric pump 23, or a pressure device that discharges compressed fluid by operation of the piezoelectric pump 23. Examples of the pressure device include a sphygmomanometer. Examples of the suction device include a nasal aspirator for removing mucus from a living body, a sputum aspirator for removing sputum from a living body, a breast pump for collecting breast milk from a living body, and a drainage device for removing pleural fluid or blood from a living body.

A configuration of the piezoelectric element driving circuit 150 will now be described with reference to FIGS. 2 and 3. First, a configuration of the driving circuit 10 will be described.

The driving circuit 10 includes a differential amplifier circuit with a low pass filter or LPF (hereinafter referred to as "LPF differential amplifier circuit") 12, an amplifier circuit with a band pass filter or BPF (hereinafter referred to as "BPF amplifier circuit") 13, an inverter 18, a resistor R6, and a comparator 17. The driving circuit 10 generates a driving signal on the basis of a DC supply voltage Vc output from the boosting circuit 22.

The driving circuit 10 applies a driving signal to the piezoelectric element P of the piezoelectric pump 23 to drive the piezoelectric element P. A first terminal of the piezoelectric element P is connected to the output terminal of the inverter 18. A second terminal of the piezoelectric element P is connected to the resistor R6. That is, the resistor R6 is connected in series to the piezoelectric element P.

The resistor R6 is connected at both ends thereof to the input terminal of the LPF differential amplifier circuit 12. The LPF differential amplifier circuit 12 amplifies the difference between voltages generated at both ends of the resistor R6 by driving current flowing through the piezoelectric element P, and then outputs a voltage signal.

The cutoff frequency of the low pass filter of the LPF differential amplifier circuit 12 is set such that the resonant frequency of the piezoelectric element P in a predetermined vibration mode is within the pass band, and that the frequencies of the third and higher harmonics of the resonant frequency are within the attenuation band. This reduces harmonic components of the resonant frequency of the piezoelectric element P in the predetermined vibration mode.

The output terminal of the LPF differential amplifier circuit 12 is connected to the input terminal of the BPF amplifier circuit 13. The BPF amplifier circuit 13 amplifies the input voltage signal with a predetermined gain and outputs it.

The pass band of the band pass filter of the BPF amplifier circuit 13 is set such that the resonant frequency of the piezoelectric element P in the predetermined vibration mode is within the pass band. Also, the pass band of the band pass filter of the BPF amplifier circuit 13 is set such that the resonant frequency of the piezoelectric element P in a vibration mode different from the predetermined vibration mode, the frequency of the second harmonics of the resonant frequency, and the frequency of noise (e.g., spike noise) are within the attenuation band.

This reduces the resonant frequency components of the piezoelectric element P in the vibration mode different from the predetermined vibration mode and the second harmonic components of the resonant frequency. Thus, an output signal Vsin of the BPF amplifier circuit 13 is sinusoidal, as illustrated in FIG. 3.

The output terminal of the amplifier circuit 13 is connected to the input terminal of the comparator 17, and also to the input terminal of the inverter 18. The output terminal of the comparator 17 is connected to the resistor R6. The output terminal of the inverter 18 is connected to the first terminal of the piezoelectric element P.

The comparator 17 generates a first driving signal, as illustrated in FIG. 3, on the basis of the DC supply voltage Vc output from the boosting circuit 22. As illustrated in FIG. 3, if the level of the input signal Vsin is at or above a midpoint voltage $V_{MC}$, the comparator 17 drives the output signal Hi (DC supply voltage Vc), whereas if the level of the input signal Vsin is below the midpoint voltage $V_{MC}$, the comparator 17 drives the output signal Low (voltage 0 V). Thus, the output signal of the comparator 17, that is, the first driving signal is a rectangular signal with a duty ratio of 50%.

The inverter 18 generates a second driving signal, as illustrated in FIG. 3, on the basis of the DC supply voltage Vc output from the boosting circuit 22. As illustrated in FIG. 3, if the level of the input signal Vsin is at or above the midpoint voltage $V_{MC}$, the inverter 18 drives the output signal Low (voltage 0 V), whereas if the level of the input signal Vsin is below the midpoint voltage $V_{MC}$, the inverter 18 drives the output signal Hi (DC supply voltage Vc). Thus, the output signal of the inverter 18, that is, the second driving signal is a rectangular signal with a duty ratio of 50%. The phase of the output signal of the inverter 18 is the inverse of that of the output signal of the comparator 17.

Therefore, as illustrated in FIG. 3, the driving signal applied to the piezoelectric element P is a rectangular signal having a duty ratio of 50% and an amplitude (2Vc) which is double the amplitude of the first or second driving signal.

The configuration of each of the waveform shaping circuit 110 and the computing circuit 111 will now be described with reference to FIG. 2.

The waveform shaping circuit 110 includes a capacitor C1, a resistor R4, a resistor R5, a diode D1, and a smoothing capacitor C11. The computing circuit 111 includes a resistor R1, a resistor R2, and a resistor R3. The MCU 112 is connected through a resistor R7 to the computing circuit 111.

The waveform shaping circuit 110 extracts, from the driving circuit 10, the voltage signal Vsin proportional to driving current flowing through the piezoelectric element P. On the basis of the voltage signal Vsin, the waveform shaping circuit 110 and the computing circuit 111 determine a voltage value Vd corresponding to the driving current flowing through the piezoelectric element P.

Specifically, in the waveform shaping circuit 110, the DC of the output signal Vsin of the BPF amplifier circuit 13 is blocked by the capacitor C1. The voltage of the resulting signal is divided between the resistor R4 and the resistor R5, subjected to half-wave rectification by the diode D1, and smoothed by the smoothing capacitor C11. Then, the waveform shaping circuit 110 outputs the smoothed voltage Vd from the smoothing capacitor C11 to the computing circuit 111.

The computing circuit 111 divides the input voltage Vd between the resistor R3 and the resistor R2, and outputs the resulting voltage to the boosting circuit 22. Also, the computing circuit 111 divides the DC supply voltage Vc between the resistor R1 and the resistor R2, and outputs the resulting voltage to the boosting circuit 22. The DC output of the MCU 112 is divided between the resistor R7 and the resistor R2 and output to the boosting circuit 22. The computing circuit 111 thus outputs, to the boosting circuit 22, a voltage Vfb as a control signal that reduces changes in driving current.

A configuration of the boosting circuit 22 will now be described with reference to FIG. 4.

The boosting circuit 22 includes a boost control circuit 122, a switch element Q1, an inductor L, a diode D2, and a capacitor C2.

As illustrated in FIG. 4, on the basis of the voltage Vfb serving as a control signal, the boost control circuit 122 boosts an input supply voltage Vb (DC 1.5 V in the present embodiment) input from the battery 21, by controlling the switching of the switch element Q1. Then the boosting circuit 22 outputs the resulting DC supply voltage Vc (DC 30 V in the present embodiment). The DC supply voltage Vc output from the boosting circuit 22 is supplied to the driving circuit 10.

The sinusoidal signal Vsin proportional to the driving current for the piezoelectric element P in the driving circuit 10 is fed back through the waveform shaping circuit 110 and the computing circuit 111 to the boosting circuit 22. In accordance with Equation 1 below, the boosting circuit 22 changes the DC supply voltage Vc of the driving circuit 10 in a direction opposite the direction of change of the voltage Vd so as to keep the voltage Vfb constant (i.e., so as to reduce changes in driving current). The constant value of the voltage Vfb of the boosting circuit 22 is always set to be constant by a reference voltage internally generated by the boosting circuit 22.

$$Vc = \frac{R1}{R3} * (Vfb - Vd) + \frac{R1}{R7} * (Vfb - Vmcu) + \left(\frac{R1}{R2} + 1\right) * Vfb \quad \text{[Equation 1]}$$

Specifically, when driving current for the piezoelectric element P increases, the boosting circuit 22 lowers the DC supply voltage Vc as the voltage Vd increases, whereas when driving current for the piezoelectric element P decreases, the boosting circuit 22 raises the DC supply voltage Vc as the voltage Vd decreases. The computing circuit 111 thus regulates the driving current for the piezoelectric element P to a constant current value.

For example, if the resistor R7 has an infinite resistance, the boosting circuit 22 changes, in accordance with Equation 2 below, the DC supply voltage Vc of the driving circuit 10 in a direction opposite the direction of change of the voltage Vd so as to keep the voltage Vfb constant (i.e., so as to reduce changes in driving current).

$$Vc = \left(\frac{R1}{R2} + 1\right) * Vfb \quad \text{[Equation 2]}$$

By setting the element values and characteristics of each circuit element such that the gain of the feedback system is at least one and the phase angle is 0° at the resonant frequency of the piezoelectric element P in the predetermined vibration mode, Barkhausen oscillation conditions are satisfied and the piezoelectric element P is driven at the resonant frequency.

The tendency of the piezoelectric pump 23, associated with changes in driving current supplied to the piezoelectric element P, will now be described.

Figure 5:
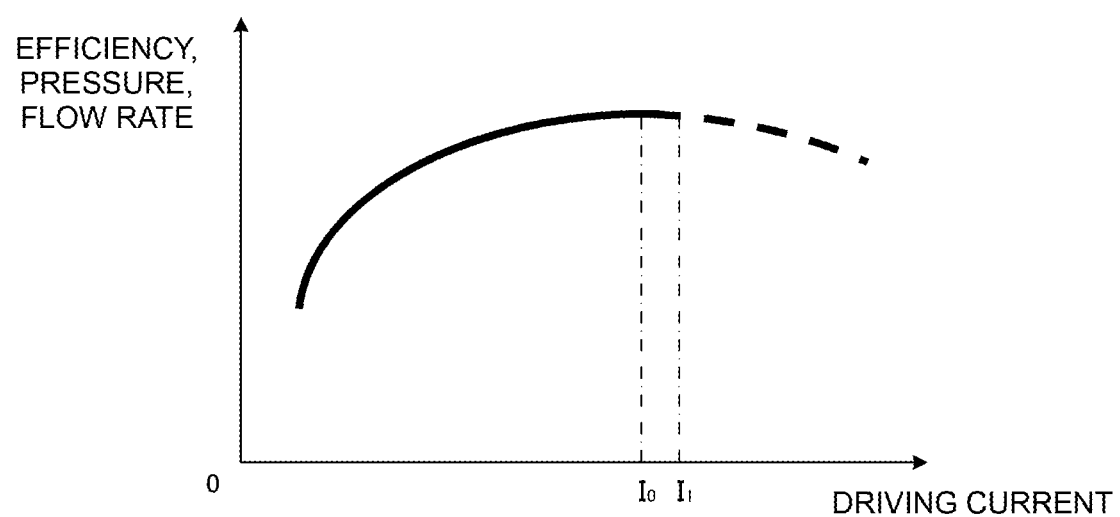
FIG. 5 is a graph showing a relationship between efficiency, pressure, or flow rate in a piezoelectric pump 23 illustrated in FIG. 1 and driving current supplied to a piezoelectric element P.
Figure 6:
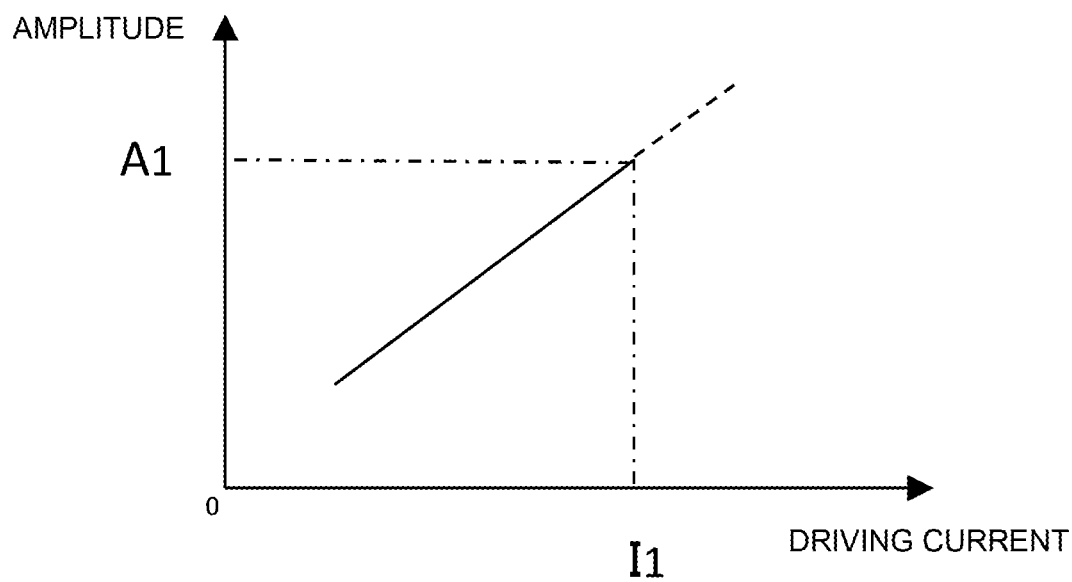
FIG. 6 is a graph showing a relationship between driving current supplied to the piezoelectric element P illustrated in FIG. 1 and the amplitude of the piezoelectric element P.
Figure 7:
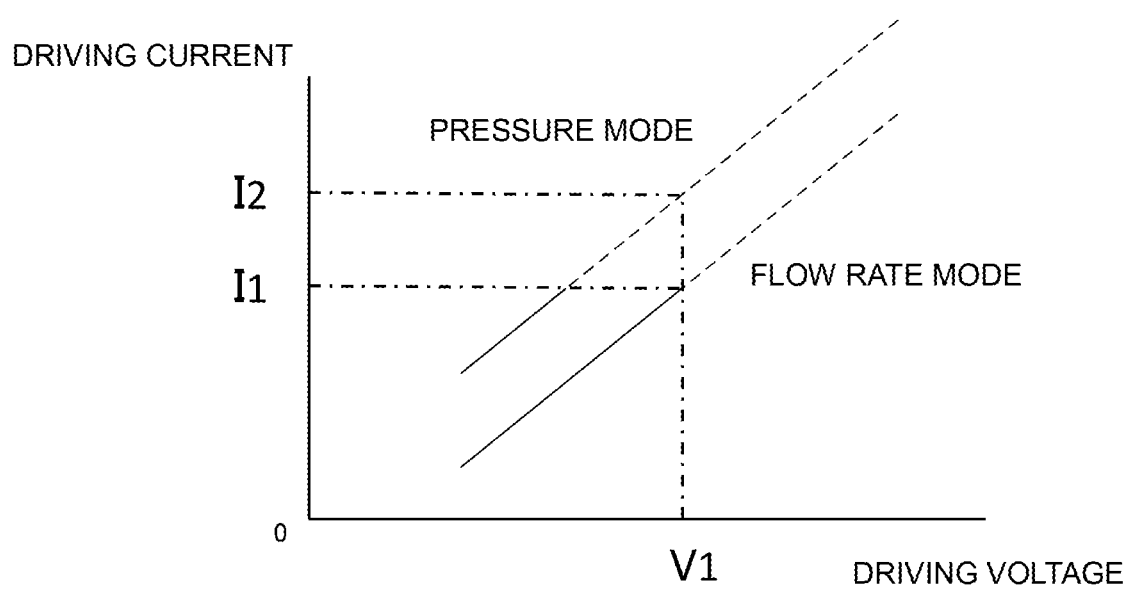
FIG. 7 is a graph showing a relationship between driving current and driving voltage for the piezoelectric element P when the piezoelectric pump 23 illustrated in FIG. 1 operates in a flow rate mode and a pressure mode.
Figure 8:
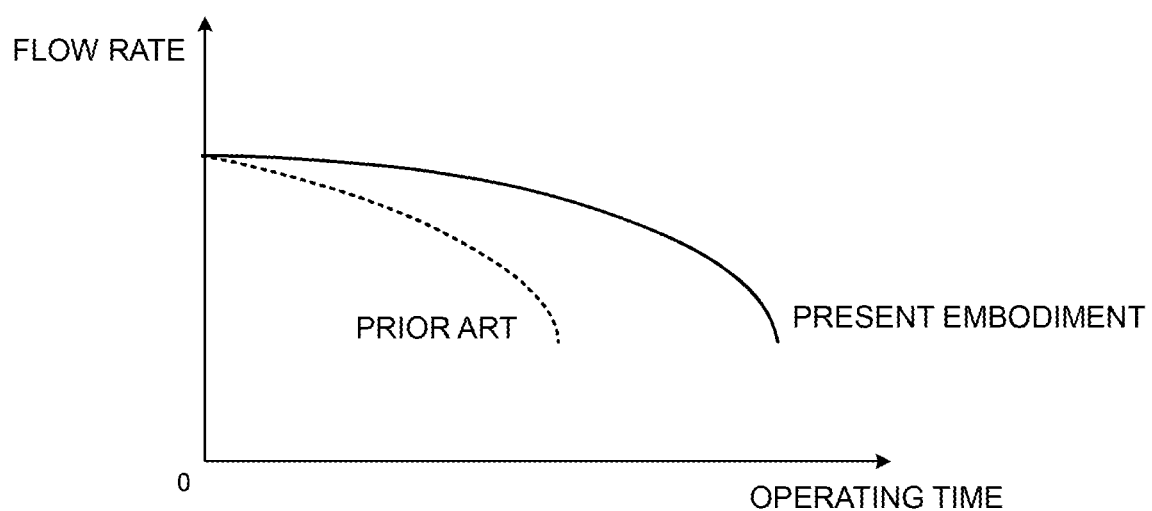
FIG. 8 is a graph showing a relationship between operating time and flow rate in a piezoelectric pump in each of the fluid control apparatus 100 illustrated in FIG. 1 and a conventional fluid control apparatus.

FIG. 5 is a graph showing a relationship between efficiency, pressure, or flow rate in the piezoelectric pump 23 illustrated in FIG. 1 and driving current supplied to the piezoelectric element P. FIG. 6 is a graph showing a relationship between driving current supplied to the piezoelectric element P illustrated in FIG. 1 and the amplitude of the piezoelectric element P. FIG. 7 is a graph showing a relationship between driving current and driving voltage for the piezoelectric element P when the piezoelectric pump 23 illustrated in FIG. 1 operates in a flow rate mode and a pressure mode. FIG. 8 is a graph showing a relationship between operating time and flow rate in a piezoelectric pump in each of the fluid control apparatus 100 illustrated in FIG. 1 and a conventional fluid control apparatus.

Note that a dotted line in FIGS. 5 to 7 indicates a range where the piezoelectric element P cracks. In FIG. 7, a flow rate mode is a mode where back pressure is zero and the flow rate is nonzero, whereas a pressure mode is a mode where the flow rate is zero and back pressure (negative pressure in the drawing) is nonzero. FIG. 8 is a graph that compares the life of the battery 21 connected to the piezoelectric element driving circuit 150 of the fluid control apparatus 100 and the life of the battery 21 connected to the piezoelectric element driving circuit of the conventional fluid control apparatus. FIG. 8 shows that as the operating time of the piezoelectric pump increases, the capacity of the battery 21 decreases, and the flow rate in the piezoelectric pump decreases as the capacity of the battery 21 decreases. Note that the piezoelectric element driving circuit of the conventional fluid control apparatus is, for example, the piezoelectric element driving circuit described in Patent Document 1.

As illustrated in FIG. 5, in the piezoelectric element driving circuit 150, as in the case of a typical piezoelectric element driving circuit, pressure generated by the piezoelectric pump 23 and the flow rate or efficiency decrease as the driving current increases beyond $I_0$. That is, as the driving current increases beyond $I_0$, power loss increases and the life of the battery 21 shortens.

As illustrated in FIG. 6, the amplitude of the piezoelectric element P has a proportional relationship with the magnitude of driving current. As illustrated in FIG. 7, the driving voltage and the driving current supplied to the piezoelectric element P have a proportional relationship. However, the current value of driving current corresponding to a given driving voltage in the flow rate mode differs from that corresponding to the same driving voltage in the pressure mode.

As illustrated in FIGS. 5 to 7, when excessive driving current exceeding the current value $I_1$ flows through the piezoelectric element P, the amplitude of the piezoelectric element P exceeds a threshold value $A_1$ (see FIG. 6) and the piezoelectric element P may crack.

As described above, the boosting circuit 22 in the piezoelectric element driving circuit 150 sets the value of the DC supply voltage Vc on the basis of the control signal so as to reduce changes in driving current, and then outputs the DC supply voltage Vc. Thus, even when driving current for the piezoelectric element P changes, the waveform shaping circuit 110 and the computing circuit 111 regulate the driving current to a constant current value. For example, even when driving current for the piezoelectric element P changes, the waveform shaping circuit 110 and the computing circuit 111 regulate the driving current to a constant current value $I_0$ (see FIG. 5). As illustrated in FIG. 6, the amplitude of the piezoelectric element P is also constant.

Therefore, the piezoelectric element driving circuit 150 can always drive the piezoelectric element P under optimum conditions which maximize the pressure of the piezoelectric pump 23 and the flow rate in, or efficiency of, the piezoelectric pump 23. This reduces power loss. Therefore, for example, as illustrated in FIG. 8, the life of the battery 21 connected to the piezoelectric element driving circuit 150 is longer than the life of the battery 21 connected to the conventional piezoelectric element driving circuit.

The piezoelectric element driving circuit 150 can prevent excessive driving current exceeding the current value $I_1$ (see FIGS. 5 to 7) from flowing through the piezoelectric element P. Therefore, the piezoelectric element driving circuit 150 having this configuration can prevent the piezoelectric element P from cracking. For example, without necessarily having the user be conscious of whether the piezoelectric pump 23 is in the flow rate mode or pressure mode, the piezoelectric element driving circuit 150 can prevent the piezoelectric pump 23 from being broken by excessive driving current.

Therefore, the piezoelectric element driving circuit 150 can drive the piezoelectric element P under optimum conditions without necessarily using a pressure sensor or a flow rate sensor.

For example, under a negative pressure exceeding 20 kPa, the mucous membrane of a human body surface may be damaged. When the piezoelectric pump 23 suctions part of a human body, the fluid control apparatus 100 can drive the piezoelectric element P at 20 kPa or below without necessarily using a pressure sensor.

The piezoelectric element driving circuit 150 includes the boosting circuit 22. Therefore, even when the battery 21 drives the piezoelectric element P, the piezoelectric element driving circuit 150 can drive the piezoelectric element P with large amplitude.

Second Embodiment

A fluid control apparatus 200 according to a second embodiment of the present disclosure will be described with reference to the drawings.

Figure 9:
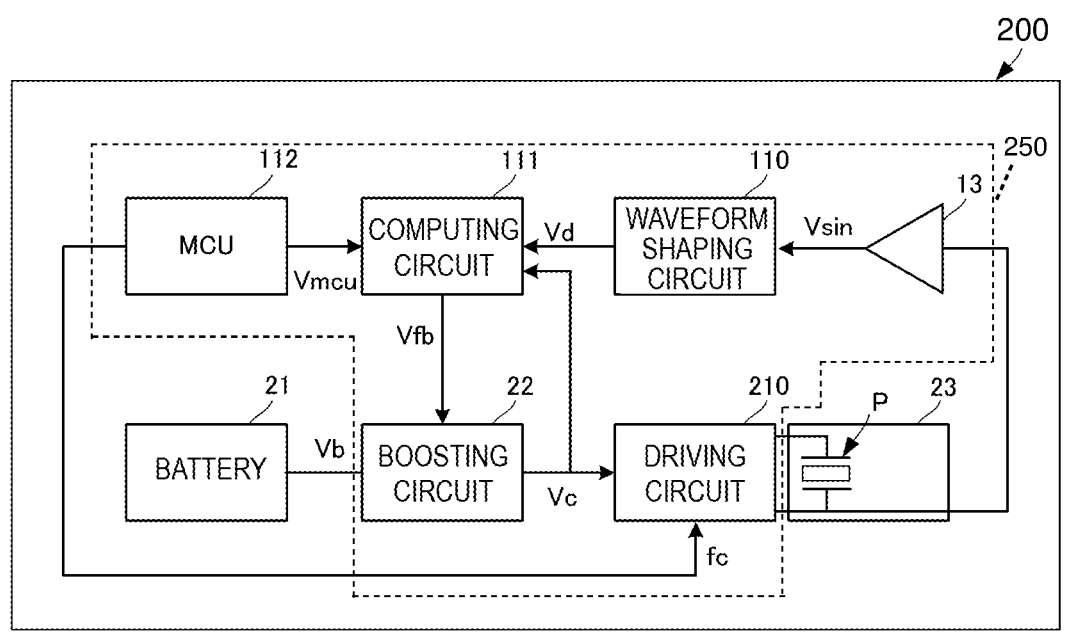
FIG. 9 is a block diagram illustrating a configuration of a fluid control apparatus 200 according to a second embodiment.
Figure 10:
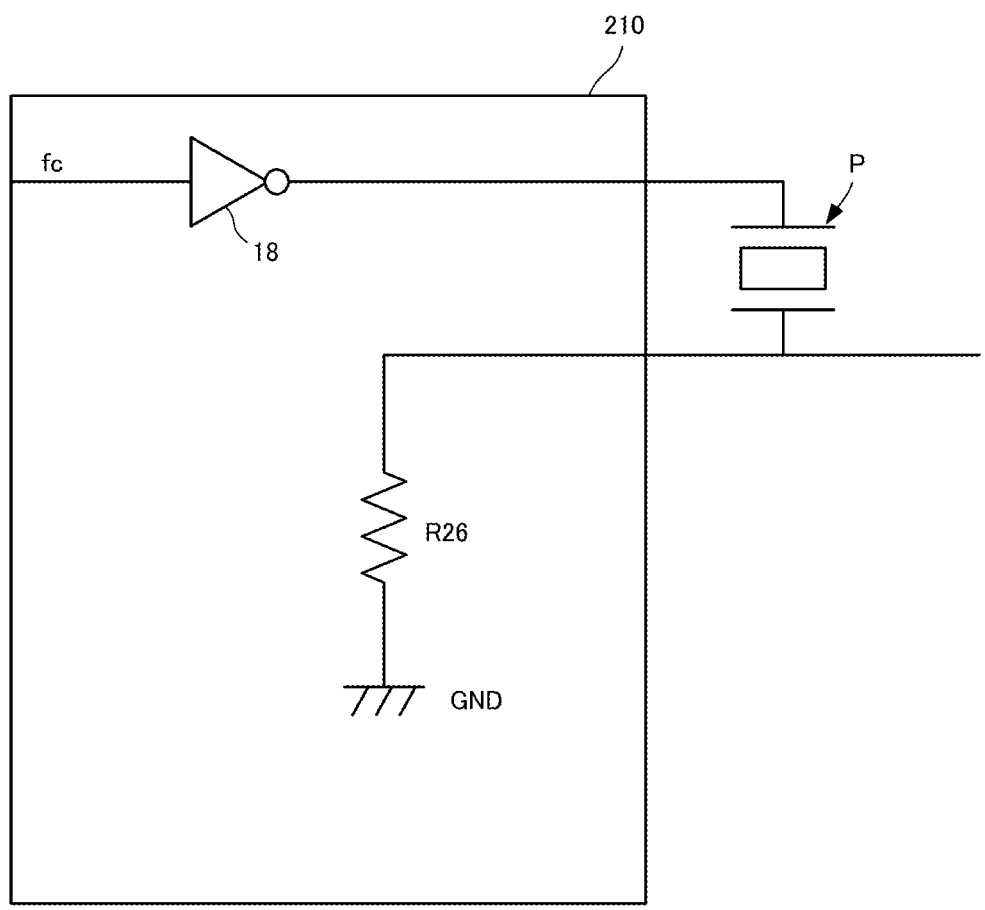
FIG. 10 is a circuit diagram illustrating a configuration of a driving circuit 210 illustrated in FIG. 9.
Figure 11:
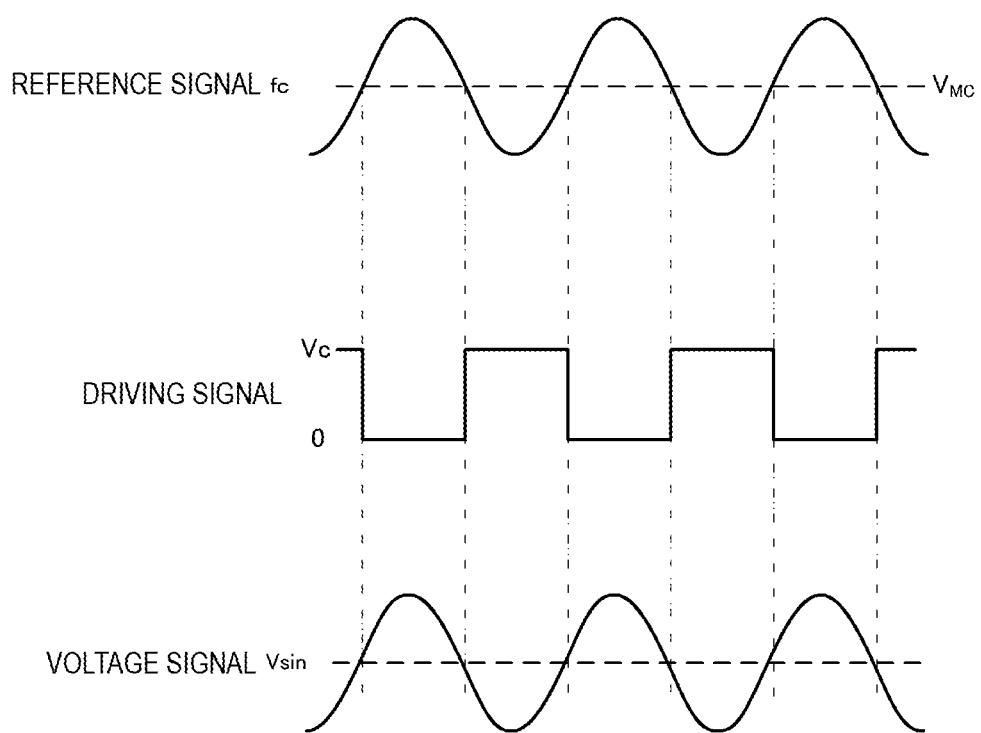
FIG. 11 illustrates voltage waveforms in a piezoelectric element driving circuit 250 illustrated in FIG. 9.

FIG. 9 is a block diagram illustrating a configuration of the fluid control apparatus 200 according to the second embodiment. FIG. 10 is a circuit diagram illustrating a configuration of a driving circuit 210 illustrated in FIG. 9. FIG. 11 illustrates voltage waveforms in a piezoelectric element driving circuit 250 illustrated in FIG. 9. The fluid control apparatus 200 is identical to the fluid control apparatus 100 except for the piezoelectric element driving circuit 250. The other components are the same and will not be described here.

The output terminal of the MCU 112 is connected to the input terminal of the inverter 18. The output terminal of the inverter 18 is connected to the second terminal of the piezoelectric element P. The MCU 112 generates a reference signal fc and outputs it to the inverter 18.

As illustrated in FIG. 11, if the level of the reference signal fc is at or above the midpoint voltage $V_{mc}$, the inverter 18 drives the output signal Low (voltage 0 V), whereas if the level of the reference signal fc is below the midpoint voltage $V_{mc}$, the inverter 18 drives the output signal Hi (DC supply voltage Vc).

The internal circuit illustrated in FIG. 10 may be a half-bridge or full-bridge circuit having fc as an input end for control and one or each side of the piezoelectric element P as an output end.

The reference signal illustrated in FIG. 11 may be either a direct-current or rectangular signal.

A resistor R26 is connected in series to the piezoelectric element P. The first terminal of the piezoelectric element P is connected through the resistor R26 to a ground GND. The first terminal of the piezoelectric element P is also connected to the input terminal of the BPF amplifier circuit 13.

The BPF amplifier circuit 13 amplifies, with a predetermined gain, the voltage generated between both ends of the resistor R26 by driving current flowing through the piezoelectric element P, and then outputs the resulting voltage signal. The pass band of the band pass filter of the BPF amplifier circuit 13 is set such that the resonant frequency of the piezoelectric element P in the predetermined vibration mode is within the pass band.

Also, the pass band of the band pass filter of the BPF amplifier circuit 13 is set such that the resonant frequency of the piezoelectric element P in a vibration mode different from the predetermined vibration mode, the frequency of the second harmonics of the resonant frequency, and the frequency of noise (e.g., spike noise) are within the attenuation band.

This reduces the resonant frequency components of the piezoelectric element P in the vibration mode different from the predetermined vibration mode and the second harmonic components of the resonant frequency. Thus, the output signal Vsin of the BPF amplifier circuit 13 is sinusoidal, as illustrated in FIG. 11.

The sinusoidal signal Vsin proportional to the driving current for the piezoelectric element P in the driving circuit 10 is fed back through the waveform shaping circuit 110 and the computing circuit 111 to the boosting circuit 22.

The boosting circuit 22 in the piezoelectric element driving circuit 250 also sets the value of the DC supply voltage Vc on the basis of the control signal Vfb so as to reduce changes in driving current, and then outputs the DC supply voltage Vc. Thus, even when driving current for the piezoelectric element P changes, the waveform shaping circuit 110 and the computing circuit 111 regulate the driving current to a constant current value.

Therefore, like the piezoelectric element driving circuit 150, the piezoelectric element driving circuit 250 can drive the piezoelectric element P under optimum conditions without necessarily using a pressure sensor or a flow rate sensor.

Third Embodiment

A fluid control apparatus 300 according to a third embodiment of the present disclosure will be described with reference to the drawings.

Figure 12:
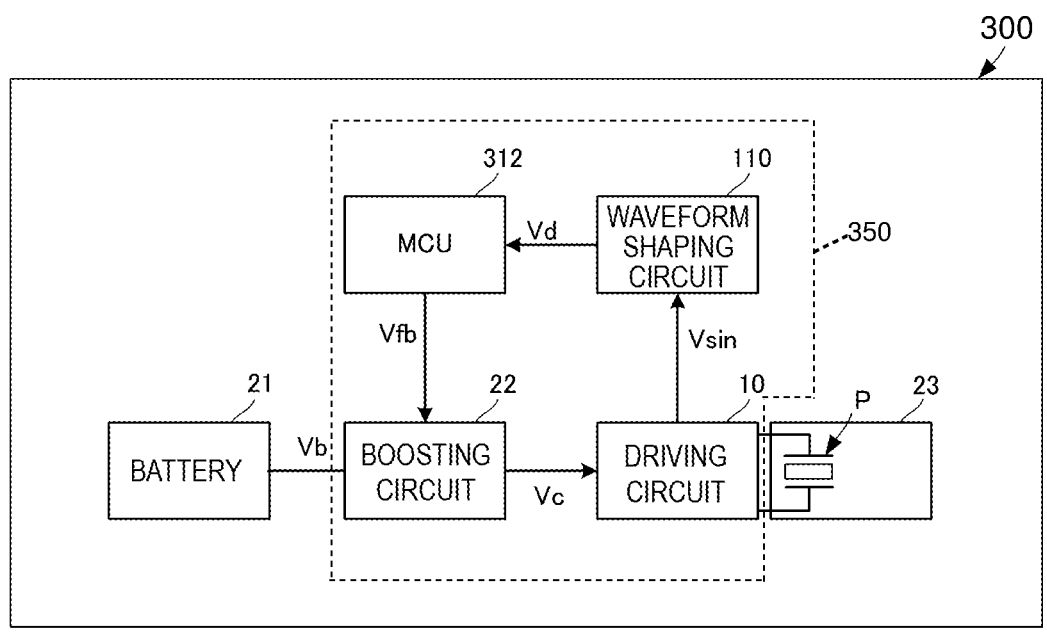
FIG. 12 is a block diagram illustrating a configuration of a fluid control apparatus 300 according to a third embodiment.

FIG. 12 is a block diagram illustrating a configuration of the fluid control apparatus 300 according to the third embodiment. The fluid control apparatus 300 is identical to the fluid control apparatus 100 except for a piezoelectric element driving circuit 350. The piezoelectric element driving circuit 350 differs from the piezoelectric element driving circuit 150 in that the computing circuit 111 is omitted and an MCU 312 is connected to the waveform shaping circuit 110 and the boosting circuit 22 instead. In the present embodiment, the waveform shaping circuit 110 and the MCU 312 form the control circuit of the present disclosure.

The MCU 312 refers to the voltage Vd input from the waveform shaping circuit 110, computes a voltage Vmcu at which the piezoelectric element P vibrates with a given amplitude, and then outputs the voltage Vmcu to the boosting circuit 22. The voltage Vmcu is thus input to the boosting circuit 22 as a control signal that reduces changes in driving current. The other components will not be described, as they are the same as those described above.

For example, flexibly changing Vmcu is effective in a suction device, such as a breast pump, required to be capable of flexibly changing the pressure. The first and second embodiments also have this effect.

The boosting circuit 22 in the piezoelectric element driving circuit 350 also sets the value of the DC supply voltage Vc on the basis of the control signal Vmcu so as to reduce changes in driving current, and then outputs the DC supply voltage Vc. Thus, even when driving current for the piezoelectric element P changes, the waveform shaping circuit 110 and the MCU 312 regulate the driving current to a constant current value.

Therefore, like the piezoelectric element driving circuit 150, the piezoelectric element driving circuit 350 can drive the piezoelectric element P under optimum conditions without necessarily using a pressure sensor or a flow rate sensor.

In the present embodiment, the MCU 312 refers to the voltage Vd input from the waveform shaping circuit 110, computes the voltage Vmcu at which the piezoelectric element P vibrates with a given amplitude, and then outputs the voltage Vmcu to the boosting circuit 22. However, the present disclosure is not limited to this. In implementation, a smoothing circuit may be provided between an MCU having no capability of computing the voltage Vmcu and the boosting circuit 22, and the MCU may output, to the smoothing circuit, a PWM signal corresponding to the voltage Vd input from the waveform shaping circuit 110. In this case, the smoothing circuit outputs, to the boosting circuit 22, the voltage Vmcu obtained by smoothing the PWM signal.

Fourth Embodiment

A fluid control apparatus 400 according to a fourth embodiment of the present disclosure will be described with reference to the drawings.

Figure 13:
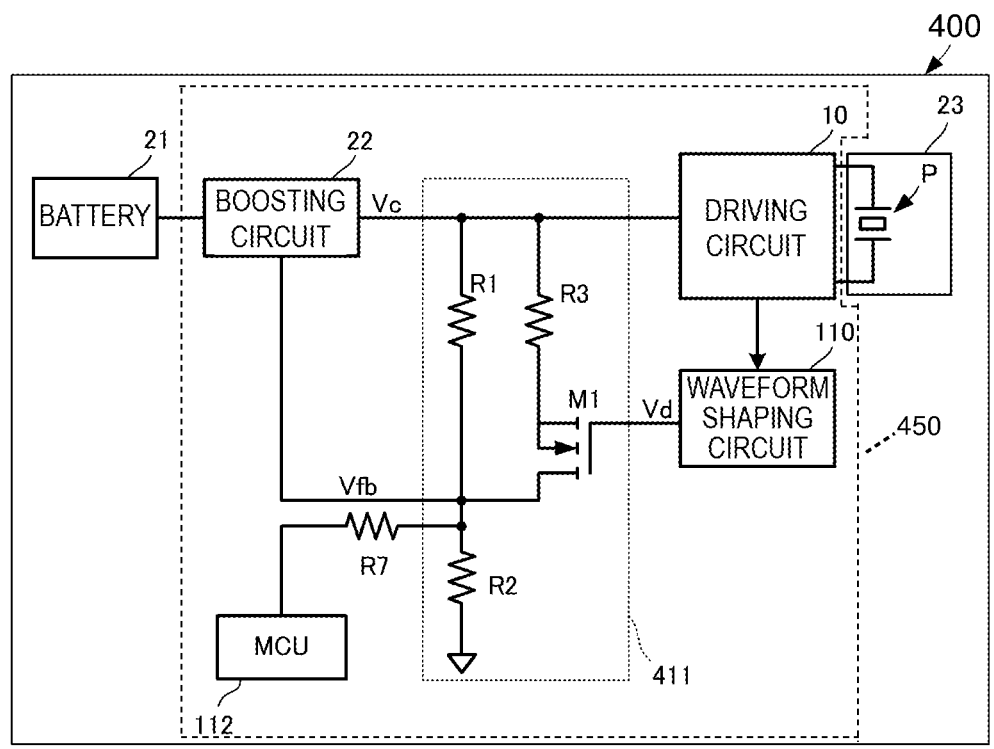
FIG. 13 is a block diagram illustrating a configuration of a fluid control apparatus 400 according to a fourth embodiment.

FIG. 13 is a block diagram illustrating a configuration of the fluid control apparatus 400 according to the fourth embodiment. The fluid control apparatus 400 is identical to the fluid control apparatus 100 except for a computing circuit 411 in a piezoelectric element driving circuit 450. The computing circuit 411 differs from the computing circuit 111 in that it further includes an FET M1. The other components of the fluid control apparatus 400 are the same as those of the fluid control apparatus 100, and the description of the same points will be omitted here.

The computing circuit 411 includes the FET M1 and the resistors R1, R2, and R3. The gate terminal of the FET M1 is connected to the waveform shaping circuit 110. The source terminal of the FET M1 is connected to one end of the resistor R3. The other end of the resistor R3 is connected to the output end of the boosting circuit 22. The drain terminal of the FET M1 is connected to a node (voltage division point) between the resistor R2 and the resistor R1.

In this configuration, the FET M1 is operated in a nonlinear region. In other words, the FET M1 is used, which operates in a nonlinear region in the range of the voltage Vd input from the waveform shaping circuit 110 for feedback. By operating in a nonlinear region, the FET M1 can increase output current, in response to an increase in input voltage, more significantly than the increase in input voltage. That is, when the input voltage Vd increases, the resistance Rfet of the FET M1 decreases.

Here, the DC supply voltage Vc, which is the output voltage of the boosting circuit 22, can be defined as follows.

$$Vc = \left(\frac{R2 + Ra}{R2}\right) * Vfb \quad \text{[Equation 3]}$$

where $$Ra = (R1 + R3 + Rfet)/\{R1 * (R3 + Rfet)\}$$

Therefore, when the voltage Vd input to the computing circuit 411 increases, the DC supply voltage Vc of the boosting circuit 22 decreases. In this case, the amount of decrease in the DC supply voltage Vc is larger than the amount of increase in the voltage Vd input to the computing circuit 411.

That is, when driving current for the piezoelectric element P increases, the DC supply voltage Vc of the boosting circuit 22 decreases. Conversely, when driving current for the piezoelectric element P decreases, the DC supply voltage Vc of the boosting circuit 22 increases.

The piezoelectric element driving circuit 450 according to the present embodiment can thus stably and reliably keep the driving current constant.

The FET M1 may be another amplifier circuit, such as an operational amplifier, capable of amplifying in a nonlinear region. Using the FET M1 is effective, however, in that the computing circuit 411 can be formed with an inexpensive and simple configuration.

Other Embodiments

Although the piezoelectric element driving circuits 150, 250, and 350 drive the piezoelectric element P of the piezoelectric pump 23 in the embodiments described above, the present disclosure is not limited to this. In implementation, the piezoelectric element driving circuits 150, 250, and 350 are also applicable, for example, to piezoelectric actuators, piezoelectric transformers, piezoelectric MEMS, and motors.

Although the piezoelectric element driving circuits 150, 250, and 350 are connected to the battery 21 and boost the input supply voltage Vb in the embodiments described above, the present disclosure is not limited to this. In implementation, the piezoelectric element driving circuits 150, 250, and 350 may be connected to another direct-current power supply.

Although the waveform shaping circuit 110 extracts, from the driving circuit 10 or 210, the sinusoidal voltage signal Vsin output from the BPF amplifier circuit 13 in the embodiments described above, the present disclosure is not limited to this. In implementation, for example, the waveform shaping circuit 110 may extract, from the driving circuit 10 or 210, a rectangular voltage signal before it passes through the BPF amplifier circuit 13.

Last, it should be considered that the foregoing description of embodiments is illustrative, not restrictive, in all aspects. The scope of the present disclosure is defined by the appended claims, rather than by the forgoing description of embodiments. The scope of the present disclosure is intended to include all changes within meanings and ranges equivalent to the claims.

REFERENCE SIGNS LIST

P: piezoelectric element
10: driving circuit
12: differential amplifier circuit with LPF
13: amplifier circuit with BPF
17: comparator
18: inverter
21: battery
22: boosting circuit
23: piezoelectric pump
100: fluid control apparatus
110: waveform shaping circuit
111: computing circuit
112: MCU
122: boost control circuit
150: piezoelectric element driving circuit
200: fluid control apparatus
210: driving circuit
250: piezoelectric element driving circuit
300: fluid control apparatus
312: MCU
350: piezoelectric element driving circuit
400: fluid control apparatus
450: piezoelectric element driving circuit

The invention claimed is:

1. A piezoelectric element driving circuit comprising:
a power supply circuit configured to output a direct current (DC) supply voltage;
a driving circuit configured to generate a driving signal based on the DC supply voltage output from the power supply circuit, and to apply the driving signal to a piezoelectric element;
a waveform shaping circuit configured to extract, from the driving circuit, a voltage signal proportional to a driving current flowing through the piezoelectric element, and to smooth the voltage signal and output a smoothed signal; and
a control circuit configured to determine a voltage value corresponding to the driving current based on the smoothed signal, and to output a control signal based on the voltage value,
wherein the power supply circuit is configured to control a magnitude of the DC supply voltage based on the control signal, thereby stabilizing fluctuations in the driving current.

2. The piezoelectric element driving circuit according to claim 1, wherein the power supply circuit comprises a boosting circuit configured to raise voltage output from a battery to the DC supply voltage, and to output the DC supply voltage.

3. The piezoelectric element driving circuit according to claim 1, wherein the driving circuit includes a resistor connected in series with the piezoelectric element, and a differential amplifier circuit configured to amplify a difference between voltages generated at both ends of the resistor by the driving current and to output the voltage signal.

4. The piezoelectric element driving circuit according to claim 3, wherein the differential amplifier circuit comprises a low pass filter that is configured to pass a resonant frequency of the piezoelectric element and to attenuate third and higher harmonics of the resonant frequency.

5. The piezoelectric element driving circuit according to claim 3, wherein the driving circuit further comprises:
a bandpass filter amplifier and a comparator connected between an output of the differential amplifier and the resistor, an input of the differential amplifier being connected between the comparator and the resistor; and an inverter connected between the piezoelectric element and a node between the bandpass filter amplifier and the comparator.

6. The piezoelectric element driving circuit according to claim 5, wherein the control circuit is configured to extract the voltage signal from the node between the bandpass filter amplifier and the comparator.

7. The piezoelectric element driving circuit according to claim 5, wherein the bandpass amplifier circuit comprises a bandpass filter that is configured to pass a resonant frequency of the piezoelectric element according to a first mode and to attenuate a resonant frequency of the piezoelectric element according to a second mode, a second harmonic of the resonant frequency, and noise.

8. The piezoelectric element driving circuit according to claim 1, wherein the voltage signal that the control circuit is configured to extract from the driving circuit is a sinusoidal signal.

9. The piezoelectric element driving circuit according to claim 1, wherein the control circuit is configured to output the control signal using an amplifier circuit configured to amplify in a nonlinear region.

10. A fluid control apparatus comprising:
the piezoelectric element driving circuit according to claim 1; and
a piezoelectric pump including the piezoelectric element driven by the piezoelectric element driving circuit, wherein driving the piezoelectric element causes the piezoelectric pump to transfer a fluid.

11. The fluid control apparatus according to claim 10, wherein the piezoelectric pump suctions fluid by generating a negative pressure.

12. The fluid control apparatus according to claim 10, wherein the piezoelectric pump discharges compressed fluid by generating a positive pressure.

13. The piezoelectric element driving circuit according to claim 1, wherein the waveform shaping circuit comprises a smoothing capacitor connected between ground and a signal path through the waveform shaping circuit.

14. The piezoelectric element driving circuit according to claim 13, wherein the waveform shaping circuit comprises a DC blocking capacitor connected in the signal path through the waveform shaping circuit.

* * * * *